(12) United States Patent
Shrivastava et al.

(10) Patent No.: US 10,811,594 B2
(45) Date of Patent: Oct. 20, 2020

(54) PROCESS FOR HARD MASK DEVELOPMENT FOR MRAM PILLAR FORMATION USING PHOTOLITHOGRAPHY

(71) Applicant: SPIN MEMORY, Inc., Fremont, CA (US)

(72) Inventors: Prachi Shrivastava, Fremont, CA (US); Daniel Liu, Fremont, CA (US); Yuan Tung Chin, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 15/857,351

(22) Filed: Dec. 28, 2017

(65) Prior Publication Data

US 2019/0207080 A1 Jul. 4, 2019

(51) Int. Cl.
- H01L 21/00 (2006.01)
- H01L 43/02 (2006.01)
- H01L 27/22 (2006.01)
- H01L 43/12 (2006.01)

(52) U.S. Cl.
CPC ............ *H01L 43/02* (2013.01); *H01L 27/222* (2013.01); *H01L 43/12* (2013.01)

(58) Field of Classification Search
CPC ........ H01L 43/02; H01L 43/12; H01L 27/222
USPC ........................................................... 438/3
See application file for complete search history.

(56) References Cited

U.S. PATENT DOCUMENTS

| | | |
|---|---|---|
| 4,597,487 A | 7/1986 | Crosby et al. |
| 5,541,868 A | 7/1996 | Prinz |
| 5,559,952 A | 9/1996 | Fujimoto |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |

(Continued)

FOREIGN PATENT DOCUMENTS

| | | |
|---|---|---|
| CA | 2766141 | 1/2011 |
| CN | 105706259 | 6/2016 |

(Continued)

OTHER PUBLICATIONS

US 7,026,672 B2, 04/2006, Grandis (withdrawn)

(Continued)

*Primary Examiner* — David S Blum

(57) ABSTRACT

A method for fabricating an array of pillars. The method includes fabricating an MTJ (magnetic tunnel junction) film deposition metal stack on a CMOS wafer. The method selects between subsequent electron beam patterning for the wafer and photolithography patterning for the wafer. For electron beam patterning, an electron beam lithography hard mask is deposited onto the metal stack, and an electron beam is used to pattern a first array of pillars into the electron beam lithography hard mask to produce a first resulting pillar array. For photolithography patterning, a photolithography hard mask is deposited onto the metal stack, and photolithography is used to pattern a second array of pillars into the photolithography hard mask to produce a second resulting pillar array. The first resulting pillar array is substantially the same as the second resulting pillar array.

16 Claims, 5 Drawing Sheets

E beam resist pillars using E beam lithography method.

Photolithography resist pillars using optical lithography

(56) References Cited

U.S. PATENT DOCUMENTS

| | | |
|---|---|---|
| 5,695,864 A | 12/1997 | Slonczewski |
| 5,732,016 A | 3/1998 | Chen et al. |
| 5,751,647 A | 5/1998 | O'Toole |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,064,948 A | 5/2000 | West |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,447,935 B1 | 9/2002 | Zhang et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,903 B1 | 4/2003 | Savtchenko et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,608,776 B2 | 8/2003 | Hidaka |
| 6,635,367 B2 | 10/2003 | Igarashi et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,731,537 B2 | 5/2004 | Kanamori |
| 6,744,086 B2 | 6/2004 | Daughton et al. |
| 6,750,491 B2 | 6/2004 | Sharma et al. |
| 6,751,074 B2 | 6/2004 | Inomata et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,807,091 B2 | 10/2004 | Saito |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,839,821 B2 | 1/2005 | Estakhri |
| 6,842,317 B2 | 1/2005 | Sugita et al. |
| 6,842,366 B2 | 1/2005 | Chan |
| 6,847,547 B2 | 1/2005 | Albert et al. |
| 6,879,512 B2 | 4/2005 | Luo |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,936,479 B2 | 8/2005 | Sharma |
| 6,938,142 B2 | 8/2005 | Pawlowski |
| 6,956,257 B2 | 10/2005 | Zhu et al. |
| 6,958,507 B2 | 10/2005 | Atwood et al. |
| 6,958,927 B1 | 10/2005 | Nguyen et al. |
| 6,967,863 B2 | 11/2005 | Huai |
| 6,980,469 B2 | 12/2005 | Kent et al. |
| 6,984,529 B2 | 1/2006 | Stojakovic et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,371 B2 | 2/2006 | Matsuoka |
| 7,006,375 B2 | 2/2006 | Covington |
| 7,009,877 B1 | 3/2006 | Huai et al. |
| 7,033,126 B2 | 4/2006 | Van Den Berg |
| 7,041,598 B2 | 5/2006 | Sharma |
| 7,045,368 B2 | 5/2006 | Hong et al. |
| 7,054,119 B2 | 5/2006 | Sharma et al. |
| 7,057,922 B2 | 6/2006 | Fukumoto |
| 7,095,646 B2 | 8/2006 | Slaughter et al. |
| 7,098,494 B2 | 8/2006 | Pakala et al. |
| 7,106,624 B2 | 9/2006 | Huai et al. |
| 7,110,287 B2 | 9/2006 | Huai et al. |
| 7,149,106 B2 | 12/2006 | Mancoff et al. |
| 7,161,829 B2 | 1/2007 | Huai et al. |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,203,802 B2 | 4/2007 | Huras |
| 7,227,773 B1 | 6/2007 | Nguyen et al. |
| 7,233,039 B2 | 6/2007 | Huai et al. |
| 7,242,045 B2 | 7/2007 | Nguyen et al. |
| 7,245,462 B2 | 7/2007 | Huai et al. |
| 7,262,941 B2 | 8/2007 | Li et al. |
| 7,273,780 B2 | 9/2007 | Kim |
| 7,283,333 B2 | 10/2007 | Gill |
| 7,307,876 B2 | 12/2007 | Kent et al. |
| 7,313,015 B2 | 12/2007 | Bessho |
| 7,324,387 B1 | 1/2008 | Bergemont et al. |
| 7,324,389 B2 | 1/2008 | Cernea |
| 7,335,960 B2 | 2/2008 | Han et al. |
| 7,351,594 B2 | 4/2008 | Bae et al. |
| 7,352,021 B2 | 4/2008 | Bae et al. |
| 7,369,427 B2 | 5/2008 | Diao et al. |
| 7,372,722 B2 | 5/2008 | Jeong |
| 7,376,006 B2 | 5/2008 | Bednorz et al. |
| 7,386,765 B2 | 6/2008 | Ellis |
| 7,404,017 B2 | 7/2008 | Kuo |
| 7,421,535 B2 | 9/2008 | Jarvis et al. |
| 7,436,699 B2 | 10/2008 | Tanizaki |
| 7,449,345 B2 | 11/2008 | Horng et al. |
| 7,453,719 B2 | 11/2008 | Sakimura |
| 7,476,919 B2 | 1/2009 | Hong et al. |
| 7,502,249 B1 | 3/2009 | Ding |
| 7,502,253 B2 | 3/2009 | Rizzo |
| 7,508,042 B2 | 3/2009 | Guo |
| 7,511,985 B2 | 3/2009 | Horii |
| 7,515,458 B2 | 4/2009 | Hung et al. |
| 7,515,485 B2 | 4/2009 | Lee |
| 7,532,503 B2 | 5/2009 | Morise et al. |
| 7,541,117 B2 | 6/2009 | Ogawa |
| 7,542,326 B2 | 6/2009 | Yoshimura |
| 7,573,737 B2 | 8/2009 | Kent et al. |
| 7,576,956 B2 | 8/2009 | Huai |
| 7,582,166 B2 | 9/2009 | Lampe |
| 7,598,555 B1 | 10/2009 | Papworth-Parkin |
| 7,602,000 B2 | 10/2009 | Sun et al. |
| 7,619,431 B2 | 11/2009 | DeWilde et al. |
| 7,633,800 B2 | 12/2009 | Adusumilli et al. |
| 7,642,612 B2 | 1/2010 | Izumi et al. |
| 7,660,161 B2 | 2/2010 | Van Tran |
| 7,663,171 B2 | 2/2010 | Inokuchi et al. |
| 7,675,792 B2 | 3/2010 | Bedeschi |
| 7,733,699 B2 | 6/2010 | Roohparvar |
| 7,739,559 B2 | 6/2010 | Suzuki et al. |
| 7,773,439 B2 | 8/2010 | Do et al. |
| 7,776,665 B2 | 8/2010 | Izumi et al. |
| 7,796,439 B2 | 9/2010 | Arai |

(56) References Cited

U.S. PATENT DOCUMENTS

| | | |
|---|---|---|
| 7,810,017 B2 | 10/2010 | Radke |
| 7,821,818 B2 | 10/2010 | Dieny et al. |
| 7,852,662 B2 | 12/2010 | Yang |
| 7,861,141 B2 | 12/2010 | Chen |
| 7,881,095 B2 | 2/2011 | Lu |
| 7,911,832 B2 | 3/2011 | Kent et al. |
| 7,916,515 B2 | 3/2011 | Li |
| 7,936,595 B2 | 5/2011 | Han et al. |
| 7,936,598 B2 | 5/2011 | Zheng et al. |
| 7,983,077 B2 | 7/2011 | Park |
| 7,986,544 B2 | 7/2011 | Kent et al. |
| 8,008,095 B2 | 8/2011 | Assefa et al. |
| 8,028,119 B2 | 9/2011 | Miura |
| 8,041,879 B2 | 10/2011 | Erez |
| 8,055,957 B2 | 11/2011 | Kondo |
| 8,058,925 B2 | 11/2011 | Rasmussen |
| 8,059,460 B2 | 11/2011 | Jeong et al. |
| 8,072,821 B2 | 12/2011 | Arai |
| 8,077,496 B2 | 12/2011 | Choi |
| 8,080,365 B2 | 12/2011 | Nozaki |
| 8,088,556 B2 | 1/2012 | Nozaki |
| 8,094,480 B2 | 1/2012 | Tonomura |
| 8,102,701 B2 | 1/2012 | Prejbeanu et al. |
| 8,105,948 B2 | 1/2012 | Zhong et al. |
| 8,120,949 B2 | 2/2012 | Ranjan et al. |
| 8,143,683 B2 | 3/2012 | Wang et al. |
| 8,144,509 B2 | 3/2012 | Jung |
| 8,148,970 B2 | 4/2012 | Fuse |
| 8,159,867 B2 | 4/2012 | Cho et al. |
| 8,201,024 B2 | 6/2012 | Burger |
| 8,223,534 B2 | 7/2012 | Chung |
| 8,255,742 B2 | 8/2012 | Ipek |
| 8,278,996 B2 | 10/2012 | Miki |
| 8,279,666 B2 | 10/2012 | Dieny et al. |
| 8,295,073 B2 | 10/2012 | Norman |
| 8,295,082 B2 | 10/2012 | Chua-Eoan |
| 8,334,213 B2 | 12/2012 | Mao |
| 8,345,474 B2 | 1/2013 | Oh |
| 8,349,536 B2 | 1/2013 | Nozaki |
| 8,362,580 B2 | 1/2013 | Chen et al. |
| 8,363,465 B2 | 1/2013 | Kent et al. |
| 8,374,050 B2 | 2/2013 | Zhou et al. |
| 8,386,836 B2 | 2/2013 | Burger |
| 8,415,650 B2 | 4/2013 | Greene |
| 8,416,620 B2 | 4/2013 | Zheng et al. |
| 8,422,286 B2 | 4/2013 | Ranjan et al. |
| 8,422,330 B2 | 4/2013 | Hatano et al. |
| 8,432,727 B2 | 4/2013 | Ryu |
| 8,441,844 B2 | 5/2013 | El Baraji |
| 8,456,883 B1 | 6/2013 | Liu |
| 8,456,926 B2 | 6/2013 | Ong et al. |
| 8,477,530 B2 | 7/2013 | Ranjan et al. |
| 8,492,881 B2 | 7/2013 | Kuroiwa et al. |
| 8,495,432 B2 | 7/2013 | Dickens |
| 8,535,952 B2 | 9/2013 | Ranjan et al. |
| 8,539,303 B2 | 9/2013 | Lu |
| 8,542,524 B2 | 9/2013 | Keshtbod et al. |
| 8,549,303 B2 | 10/2013 | Fifield et al. |
| 8,558,334 B2 | 10/2013 | Ueki et al. |
| 8,559,215 B2 | 10/2013 | Zhou et al. |
| 8,574,928 B2 | 11/2013 | Satoh et al. |
| 8,582,353 B2 | 11/2013 | Lee |
| 8,590,139 B2 | 11/2013 | Op DeBeeck et al. |
| 8,592,927 B2 | 11/2013 | Jan |
| 8,593,868 B2 | 11/2013 | Park |
| 8,609,439 B2 | 12/2013 | Prejbeanu et al. |
| 8,617,408 B2 | 12/2013 | Balamane |
| 8,625,339 B2 | 1/2014 | Ong |
| 8,634,232 B2 | 1/2014 | Oh |
| 8,667,331 B2 | 3/2014 | Hori |
| 8,687,415 B2 | 4/2014 | Parkin et al. |
| 8,705,279 B2 | 4/2014 | Kim |
| 8,716,817 B2 | 5/2014 | Saida |
| 8,716,818 B2 | 5/2014 | Yoshikawa et al. |
| 8,737,137 B1 | 5/2014 | Choy et al. |
| 8,755,222 B2 | 6/2014 | Kent et al. |
| 8,779,410 B2 | 7/2014 | Sato et al. |
| 8,780,617 B2 | 7/2014 | Kang |
| 8,792,269 B1 | 7/2014 | Abedifard |
| 8,810,974 B2 | 8/2014 | Noel et al. |
| 8,817,525 B2 | 8/2014 | Ishihara |
| 8,832,530 B2 | 9/2014 | Pangal et al. |
| 8,852,760 B2 | 10/2014 | Wang et al. |
| 8,853,807 B2 | 10/2014 | Son et al. |
| 8,860,156 B2 | 10/2014 | Beach et al. |
| 8,862,808 B2 | 10/2014 | Tsukamoto et al. |
| 8,867,258 B2 | 10/2014 | Rao |
| 8,883,520 B2 | 11/2014 | Satoh et al. |
| 8,902,628 B2 | 12/2014 | Ha |
| 8,966,345 B2 | 2/2015 | Wilkerson |
| 8,987,849 B2 | 3/2015 | Jan |
| 9,019,754 B1 | 4/2015 | Bedeschi |
| 9,025,378 B2 | 5/2015 | Tokiwa |
| 9,026,888 B2 | 5/2015 | Kwok |
| 9,030,899 B2 | 5/2015 | Lee |
| 9,036,407 B2 | 5/2015 | Wang et al. |
| 9,037,812 B2 | 5/2015 | Chew |
| 9,043,674 B2 | 5/2015 | Wu |
| 9,070,441 B2 | 6/2015 | Otsuka et al. |
| 9,070,855 B2 | 6/2015 | Gan et al. |
| 9,076,530 B2 | 7/2015 | Gomez et al. |
| 9,082,888 B2 | 7/2015 | Kent et al. |
| 9,104,581 B2 | 8/2015 | Fee et al. |
| 9,104,595 B2 | 8/2015 | Sah |
| 9,130,155 B2 | 9/2015 | Chepulskyy et al. |
| 9,140,747 B2 | 9/2015 | Kim |
| 9,165,629 B2 | 10/2015 | Chih |
| 9,165,787 B2 | 10/2015 | Kang |
| 9,166,155 B2 | 10/2015 | Deshpande |
| 9,178,958 B2 | 11/2015 | Lindamood |
| 9,189,326 B2 | 11/2015 | Kalamatianos |
| 9,190,471 B2 | 11/2015 | Yi et al. |
| 9,196,332 B2 | 11/2015 | Zhang et al. |
| 9,229,806 B2 | 1/2016 | Mekhanik et al. |
| 9,229,853 B2 | 1/2016 | Khan |
| 9,231,191 B2 | 1/2016 | Huang et al. |
| 9,245,608 B2 | 1/2016 | Chen et al. |
| 9,250,990 B2 | 2/2016 | Motwani |
| 9,250,997 B2 | 2/2016 | Kim et al. |
| 9,251,896 B2 | 2/2016 | Ikeda |
| 9,257,483 B2 | 2/2016 | Ishigaki |
| 9,263,667 B1 | 2/2016 | Pinarbasi |
| 9,286,186 B2 | 3/2016 | Weiss |
| 9,298,552 B2 | 3/2016 | Leem |
| 9,299,412 B2 | 3/2016 | Naeimi |
| 9,317,429 B2 | 4/2016 | Ramanujan |
| 9,324,457 B2 | 4/2016 | Takizawa |
| 9,337,412 B2 | 5/2016 | Pinarbasi et al. |
| 9,341,939 B1 | 5/2016 | Yu et al. |
| 9,342,403 B2 | 5/2016 | Keppel et al. |
| 9,349,482 B2 | 5/2016 | Kim et al. |
| 9,351,899 B2 | 5/2016 | Bose et al. |
| 9,362,486 B2 | 6/2016 | Kim et al. |
| 9,378,817 B2 | 6/2016 | Kawai |
| 9,379,314 B2 | 6/2016 | Park et al. |
| 9,389,954 B2 | 7/2016 | Pelley et al. |
| 9,396,065 B2 | 7/2016 | Webb et al. |
| 9,396,991 B2 | 7/2016 | Arvin et al. |
| 9,401,336 B2 | 7/2016 | Arvin et al. |
| 9,406,876 B2 | 8/2016 | Pinarbasi |
| 9,418,721 B2 | 8/2016 | Bose |
| 9,431,084 B2 | 8/2016 | Bose et al. |
| 9,449,720 B1 | 9/2016 | Lung |
| 9,450,180 B1 | 9/2016 | Annunziata |
| 9,455,013 B2 | 9/2016 | Kim |
| 9,466,789 B2 | 10/2016 | Wang et al. |
| 9,472,282 B2 | 10/2016 | Lee |
| 9,472,748 B2 | 10/2016 | Kuo et al. |
| 9,484,527 B2 | 11/2016 | Han et al. |
| 9,488,416 B2 | 11/2016 | Fujita et al. |
| 9,490,054 B2 | 11/2016 | Jan |
| 9,508,456 B1 | 11/2016 | Shim |
| 9,520,128 B2 | 12/2016 | Bauer et al. |
| 9,520,192 B2 | 12/2016 | Naeimi et al. |

(56) References Cited

U.S. PATENT DOCUMENTS

| | | | |
|---|---|---|---|
| 9,548,116 B2 | 1/2017 | Roy | |
| 9,548,445 B2 | 1/2017 | Lee et al. | |
| 9,553,102 B2 | 1/2017 | Wang | |
| 9,583,167 B2 | 2/2017 | Chung | |
| 9,594,683 B2 | 3/2017 | Dittrich | |
| 9,600,183 B2 | 3/2017 | Tomishima et al. | |
| 9,608,038 B2 | 3/2017 | Wang et al. | |
| 9,634,237 B2 | 4/2017 | Lee et al. | |
| 9,640,267 B2 | 5/2017 | Tani | |
| 9,646,701 B2 | 5/2017 | Lee | |
| 9,652,321 B2 | 5/2017 | Motwani | |
| 9,662,925 B2 | 5/2017 | Raksha et al. | |
| 9,697,140 B2 | 7/2017 | Kwok | |
| 9,720,616 B2 | 8/2017 | Yu | |
| 9,728,712 B2 | 8/2017 | Kardasz et al. | |
| 9,741,926 B1 | 8/2017 | Pinarbasi et al. | |
| 9,772,555 B2 | 9/2017 | Park et al. | |
| 9,773,974 B2 | 9/2017 | Pinarbasi et al. | |
| 9,780,300 B2 | 10/2017 | Zhou et al. | |
| 9,793,319 B2 | 10/2017 | Gan et al. | |
| 9,853,006 B2 | 12/2017 | Arvin et al. | |
| 9,853,206 B2 | 12/2017 | Pinarbasi et al. | |
| 9,853,292 B2 | 12/2017 | Loveridge et al. | |
| 9,858,976 B2 | 1/2018 | Ikegami | |
| 9,859,333 B2 | 1/2018 | Kim et al. | |
| 9,865,806 B2 | 1/2018 | Choi et al. | |
| 9,935,258 B2 | 4/2018 | Chen et al. | |
| 10,008,662 B2 | 6/2018 | You | |
| 10,026,609 B2 | 7/2018 | Sreenivasan et al. | |
| 10,042,588 B2 | 8/2018 | Kang | |
| 10,043,851 B1* | 8/2018 | Shen | H01L 27/222 |
| 10,043,967 B2 | 8/2018 | Chen | |
| 10,062,837 B2 | 8/2018 | Kim et al. | |
| 10,115,446 B1 | 10/2018 | Louie et al. | |
| 10,134,988 B2 | 11/2018 | Fennimore et al. | |
| 10,163,479 B2 | 12/2018 | Berger et al. | |
| 10,186,614 B2 | 1/2019 | Asami | |
| 2002/0090533 A1 | 7/2002 | Zhang et al. | |
| 2002/0105823 A1 | 8/2002 | Redon et al. | |
| 2003/0085186 A1 | 5/2003 | Fujioka | |
| 2003/0117840 A1 | 6/2003 | Sharma et al. | |
| 2003/0151944 A1 | 8/2003 | Saito | |
| 2003/0197984 A1 | 10/2003 | Inomata et al. | |
| 2003/0218903 A1 | 11/2003 | Luo | |
| 2004/0012994 A1 | 1/2004 | Slaughter et al. | |
| 2004/0026369 A1* | 2/2004 | Ying | B82Y 40/00 216/63 |
| 2004/0061154 A1 | 4/2004 | Huai et al. | |
| 2004/0094785 A1 | 5/2004 | Zhu et al. | |
| 2004/0130936 A1 | 7/2004 | Nguyen et al. | |
| 2004/0173315 A1 | 9/2004 | Leung | |
| 2004/0257717 A1 | 12/2004 | Sharma et al. | |
| 2005/0041342 A1 | 2/2005 | Huai et al. | |
| 2005/0051820 A1 | 3/2005 | Stojakovic et al. | |
| 2005/0063222 A1 | 3/2005 | Huai et al. | |
| 2005/0104101 A1 | 5/2005 | Sun et al. | |
| 2005/0128842 A1 | 6/2005 | Wei | |
| 2005/0136600 A1 | 6/2005 | Huai | |
| 2005/0158881 A1 | 7/2005 | Sharma | |
| 2005/0180202 A1 | 8/2005 | Huai et al. | |
| 2005/0184839 A1 | 8/2005 | Nguyen et al. | |
| 2005/0201023 A1 | 9/2005 | Huai et al. | |
| 2005/0237787 A1 | 10/2005 | Huai et al. | |
| 2005/0280058 A1 | 12/2005 | Pakala et al. | |
| 2006/0018057 A1 | 1/2006 | Huai | |
| 2006/0049472 A1 | 3/2006 | Diao et al. | |
| 2006/0077734 A1 | 4/2006 | Fong | |
| 2006/0087880 A1 | 4/2006 | Mancoff et al. | |
| 2006/0092696 A1 | 5/2006 | Bessho | |
| 2006/0132990 A1 | 6/2006 | Morise et al. | |
| 2006/0227465 A1 | 10/2006 | Inokuchi et al. | |
| 2007/0019337 A1 | 1/2007 | Apalkov et al. | |
| 2007/0096229 A1 | 5/2007 | Yoshikawa | |
| 2007/0242501 A1 | 10/2007 | Hung et al. | |
| 2008/0049488 A1 | 2/2008 | Rizzo | |
| 2008/0079530 A1 | 4/2008 | Weidman et al. | |
| 2008/0112094 A1 | 5/2008 | Kent et al. | |
| 2008/0151614 A1 | 6/2008 | Guo | |
| 2008/0259508 A2 | 10/2008 | Kent et al. | |
| 2008/0297292 A1 | 12/2008 | Viala et al. | |
| 2009/0046501 A1 | 2/2009 | Ranjan et al. | |
| 2009/0072185 A1 | 3/2009 | Raksha et al. | |
| 2009/0078927 A1* | 3/2009 | Xiao | H01L 43/12 257/9 |
| 2009/0091037 A1 | 4/2009 | Assefa et al. | |
| 2009/0098413 A1 | 4/2009 | Kanegae | |
| 2009/0130779 A1* | 5/2009 | Li | H01L 43/12 438/3 |
| 2009/0146231 A1 | 6/2009 | Kuper et al. | |
| 2009/0161421 A1 | 6/2009 | Cho et al. | |
| 2009/0209102 A1 | 8/2009 | Zhong et al. | |
| 2009/0231909 A1 | 9/2009 | Dieny et al. | |
| 2010/0124091 A1 | 5/2010 | Cowburn | |
| 2010/0162065 A1 | 6/2010 | Norman | |
| 2010/0193891 A1 | 8/2010 | Wang et al. | |
| 2010/0246254 A1 | 9/2010 | Prejbeanu et al. | |
| 2010/0271870 A1 | 10/2010 | Zheng et al. | |
| 2010/0290275 A1 | 11/2010 | Park et al. | |
| 2010/0311243 A1* | 12/2010 | Mao | H01L 27/222 438/694 |
| 2011/0032645 A1 | 2/2011 | Noel et al. | |
| 2011/0058412 A1 | 3/2011 | Zheng et al. | |
| 2011/0061786 A1 | 3/2011 | Mason | |
| 2011/0089511 A1 | 4/2011 | Keshtbod et al. | |
| 2011/0133298 A1 | 6/2011 | Chen et al. | |
| 2012/0028373 A1* | 2/2012 | Belen | H01L 43/12 438/3 |
| 2012/0052258 A1 | 3/2012 | Op DeBeeck et al. | |
| 2012/0069649 A1 | 3/2012 | Ranjan et al. | |
| 2012/0155156 A1 | 6/2012 | Watts | |
| 2012/0155158 A1 | 6/2012 | Higo | |
| 2012/0280336 A1 | 6/2012 | Watts | |
| 2012/0181642 A1 | 7/2012 | Prejbeanu et al. | |
| 2012/0188818 A1 | 7/2012 | Ranjan et al. | |
| 2012/0280339 A1 | 11/2012 | Zhang et al. | |
| 2012/0294078 A1 | 11/2012 | Kent et al. | |
| 2012/0299133 A1 | 11/2012 | Son et al. | |
| 2013/0001506 A1 | 1/2013 | Sato et al. | |
| 2013/0001652 A1 | 1/2013 | Yoshikawa et al. | |
| 2013/0021841 A1 | 1/2013 | Zhou et al. | |
| 2013/0244344 A1* | 9/2013 | Malmhall | B82Y 10/00 438/3 |
| 2013/0267042 A1 | 10/2013 | Satoh et al. | |
| 2013/0270661 A1 | 10/2013 | Yi et al. | |
| 2013/0307097 A1 | 11/2013 | Yi et al. | |
| 2013/0341801 A1 | 12/2013 | Satoh et al. | |
| 2014/0009994 A1 | 1/2014 | Parkin et al. | |
| 2014/0042571 A1 | 2/2014 | Gan et al. | |
| 2014/0070341 A1 | 3/2014 | Beach et al. | |
| 2014/0103472 A1 | 4/2014 | Kent et al. | |
| 2014/0136870 A1 | 5/2014 | Breternitz et al. | |
| 2014/0151837 A1 | 6/2014 | Ryu | |
| 2014/0169085 A1 | 6/2014 | Wang et al. | |
| 2014/0177316 A1 | 6/2014 | Otsuka et al. | |
| 2014/0217531 A1 | 8/2014 | Jan | |
| 2014/0252439 A1 | 9/2014 | Guo | |
| 2014/0264671 A1 | 9/2014 | Chepulskyy et al. | |
| 2014/0281284 A1 | 9/2014 | Block et al. | |
| 2015/0056368 A1 | 2/2015 | Wang et al. | |
| 2015/0279904 A1 | 10/2015 | Pinarbasi et al. | |
| 2016/0087193 A1 | 3/2016 | Pinarbasi et al. | |
| 2016/0163973 A1 | 6/2016 | Pinarbasi | |
| 2016/0218278 A1 | 7/2016 | Pinarbasi et al. | |
| 2016/0283385 A1 | 9/2016 | Boyd et al. | |
| 2016/0315118 A1 | 10/2016 | Kardasz et al. | |
| 2016/0378592 A1 | 12/2016 | Ikegami et al. | |
| 2017/0062712 A1 | 3/2017 | Choi et al. | |
| 2017/0123991 A1 | 5/2017 | Sela et al. | |
| 2017/0133104 A1 | 5/2017 | Darbari et al. | |
| 2017/0199459 A1 | 7/2017 | Ryu et al. | |
| 2018/0033957 A1* | 2/2018 | Zhang | H01L 43/12 |
| 2018/0097006 A1 | 4/2018 | Kim et al. | |
| 2018/0097175 A1* | 4/2018 | Chuang | H01L 43/08 |
| 2018/0114589 A1 | 4/2018 | El-Baraji et al. | |

(56) References Cited

U.S. PATENT DOCUMENTS

| | | |
|---|---|---|
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1 | 7/2018 | Kogler |
| 2018/0233362 A1 | 8/2018 | Glodde |
| 2018/0233363 A1 | 8/2018 | Glodde |
| 2018/0248110 A1 | 8/2018 | Kardasz et al. |
| 2018/0248113 A1 | 8/2018 | Pinarbasi et al. |
| 2018/0331279 A1* | 11/2018 | Shen .................. H01L 43/12 |

FOREIGN PATENT DOCUMENTS

| | | |
|---|---|---|
| EP | 1345277 | 9/2003 |
| FR | 2817998 | 6/2002 |
| FR | 2832542 | 5/2003 |
| FR | 2910716 | 6/2008 |
| JP | H10-004012 | 1/1998 |
| JP | H11-120758 | 4/1999 |
| JP | H11-352867 | 12/1999 |
| JP | 2001-195878 | 7/2001 |
| JP | 2002-261352 | 9/2002 |
| JP | 2002-357489 | 12/2002 |
| JP | 2003-318461 | 11/2003 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| JP | 2015-002352 | 1/2015 |
| KR | 10-2014-015246 | 9/2014 |
| WO | 2009-080636 | 7/2009 |
| WO | 2011-005484 | 1/2011 |
| WO | 2014-062681 | 4/2014 |

OTHER PUBLICATIONS

US 2016/0218273 A1, 06/2016, Pinarbasi (withdrawn)

Bhatti Sabpreet et al., "Spintronics Based Random Access Memory: a Review," Material Today, Nov. 2107, pp. 530-548, vol. 20, No. 9, Elsevier.

Helia Naeimi, et al., "STTRAM Scaling and Retention Failure," Intel Technology Journal, vol. 17, Issue 1, 2013, pp. 54-75 (22 pages).

S. Ikeda, et al., "A Perpendicular-Anisotropy CoFeB—MgO Magnetic Tunnel Junction", Nature Materials, vol. 9, Sep. 2010, pp. 721-724 (4 pages).

R.H. Kock, et al., "Thermally Assisted Magnetization Reversal in Submicron-Sized Magnetic Thin Films", Physical Review Letters, The American Physical Society, vol. 84, No. 23, Jun. 5, 2000, pp. 5419-5422 (4 pages).

K.J. Lee, et al., "Analytical Investigation of Spin-Transfer Dynamics Using Perpendicular-to-Plane Polarizer", Applied Physics Letters, American Insitute of Physics, vol. 86, (2005), pp 022505-1 to 022505-3 (3 pages).

Kirsten Martens, et al., "Thermally Induced Magnetic Switching in Thin Ferromagnetic Annuli", NSF grants PHY-0351964 (DLS), 2005, 11 pages.

Kristen Martens, et al., "Magnetic Reversal in Nanoscropic Ferromagnetic Rings", NSF grants PHY-0351964 (DLS) 2006, 23 pages.

"Magnetic Technology Spintronics, Media and Interface", Data Storage Institute, R&D Highlights, Sep. 2010, 3 pages.

Daniel Scott Matic, "A Magnetic Tunnel Junction Compact Model for STT-RAM and MeRAM", Master Thesis University of California, Los Angeles, 2013, pp. 43.

* cited by examiner

PROCESS FOR HARD MASK DEVELOPMENT FOR MRAM PILLAR FORMATION USING PHOTOLITHOGRAPHY

FIELD OF THE INVENTION

Embodiments of the present invention are generally related to the fabrication of integrated circuit structures used in memory systems that can be used by computer systems, including embedded computer systems.

BACKGROUND OF THE INVENTION

Magnetoresistive random-access memory ("MRAM") is a non-volatile memory technology that stores data through magnetic storage elements. These elements are two ferromagnetic plates or electrodes that can hold a magnetic field and are separated by a non-magnetic material, such as a non-magnetic metal or insulator. This structure is known as a magnetic tunnel junction (MTJ).

MRAM devices can store information by changing the orientation of the magnetization of the free layer of the MTJ. In particular, based on whether the free layer is in a parallel or anti-parallel alignment relative to the reference layer, either a one or a zero can be stored in each MRAM cell. Due to the spin-polarized electron tunneling effect, the electrical resistance of the cell change due to the orientation of the magnetic fields of the two layers. The electrical resistance is typically referred to as tunnel magnetoresistance (TMR) which is a magnetoresistive effect that occurs in a MTJ. The cell's resistance will be different for the parallel and anti-parallel states and thus the cell's resistance can be used to distinguish between a one and a zero. One important feature of MRAM devices is that they are non-volatile memory devices, since they maintain the information even when the power is off.

MRAM devices are considered as the next generation structures for a wide range of memory applications. MRAM products based on spin torque transfer switching are already making its way into large data storage devices. Spin transfer torque magnetic random access memory (STT-MRAM), or spin transfer switching, uses spin-aligned (polarized) electrons to change the magnetization orientation of the free layer in the magnetic tunnel junction. In general, electrons possess a spin, a quantized number of angular momentum intrinsic to the electron. An electrical current is generally unpolarized, e.g., it consists of 50% spin up and 50% spin down electrons. Passing a current though a magnetic layer polarizes electrons with the spin orientation corresponding to the magnetization direction of the magnetic layer (e.g., polarizer), thus produces a spin-polarized current. If a spin-polarized current is passed to the magnetic region of a free layer in the MTJ device, the electrons will transfer a portion of their spin-angular momentum to the magnetization layer to produce a torque on the magnetization of the free layer. Thus, this spin transfer torque can switch the magnetization of the free layer, which, in effect, writes either a one or a zero based on whether the free layer is in the parallel or anti-parallel states relative to the reference layer.

The fabrication of MRAM involves the formation of small MTJ (Magnetic Tunnel Junction) patterns in pillar shapes. The pillars or pillar structures can be patterned on a hard mask layer and then transferred to MTJ film metal stack. The patterning of pillars on a hard mask layer is traditionally done using an electron beam in a research environment. However, for high volume production, electron beam patterning is not cost effective as the process is very slow. Alternately, these pillars can be patterned using optical lithography tools.

Optical lithography tools are much faster and are more commonly used in a high volume manufacturing environment. Optical lithography resolution is limited by diffraction. Since the pillars, when printed onto a layer of photoresist, are two dimensional features, it is more challenging to achieve the same resolution as the resolution can be achieved by a one dimensional pattern such as a line.

Usually a process is perfected on an experimental fabrication level using an electron beam for patterning. Conventionally, the entire fabrication process must be reconfigured if the patterning of pillars is to be done using optical lithography patterning instead of electron beam patterning.

Thus, what is needed is a method for fabricating an MTJ film deposition metal stack that is suited to both an electron beam patterning process and a photolithographic patterning process. What is needed is a method that can be easily adapted to both electron beam patterning (e.g., during research and development) and optical lithography patterning (e.g., during volume production).

SUMMARY OF THE INVENTION

Embodiments of the present invention implement a method for fabricating an MTJ film deposition metal stack that is suited to both electron beam patterning processes and photolithographic patterning processes. Embodiments of the present invention implement a method that can be easily adapted to both electron beam patterning (e.g., during research and development) and optical lithography patterning (e.g., during volume production).

In one embodiment, the present invention is implemented as a method for fabricating an array of pillars. The method includes fabricating an MTJ (magnetic tunnel junction) film deposition metal stack on a CMOS wafer. The method selects between subsequent electron beam patterning for the wafer (e.g., for research and development wafers) and photolithography patterning for the wafer (e.g., for volume production wafers). For electron beam patterning, an electron beam lithography hard mask is deposited onto the metal stack, and an electron beam is used to pattern a first array of pillars into the electron beam lithography hard mask to produce a first resulting pillar array. For photolithography patterning, a photolithography hard mask is deposited onto the metal stack (e.g., which can accept either electron beam lithography hard masks or photolithography hard masks), and photolithography is used to pattern a second array of pillars into the photolithography hard mask to produce a second resulting pillar array. The first resulting pillar array is substantially the same as the second resulting pillar array.

In one embodiment, the photolithography hard mask comprises a multilayer photolithography hard mask. In one embodiment, the reactive ion etch process etches the electron beam lithography hard mask to form hard mask pillars on top of the metal stack. In one embodiment, reactive ion etching (REI) etches the photolithography hard mask to form hard mask pillars on top of the metal stack.

In one embodiment, the photolithography hard mask comprises a multilayer photolithography hard mask comprising a bottom antireflective coating (BARC) layer, a first hard mask layer, and a second hard mask layer.

In one embodiment, wafers produced using electron beam patterning and wafers produced using photolithography patterning proceed through a common subsequent MTJ fabrication process.

In one embodiment, the first hard mask layer comprises tantalum nitride and the second hard mask layer comprises silicon oxide.

In one embodiment, the present invention is implemented as a method for producing pillar arrays in a wafer fabrication process. The method includes fabricating an MTJ (magnetic tunnel junction) film deposition metal stack on a plurality of CMOS wafers. For each of the plurality of wafers, the method selects between subsequent electron beam patterning for the wafer and photolithography patterning for the wafer. For electron beam patterning, an electron beam lithography hard mask is deposited onto the metal stack, and an electron beam is used to pattern a first array of pillars into the electron beam lithography hard mask to produce a first resulting pillar array. For photolithography patterning, a multilayer photolithography hard mask is deposited onto the metal stack, and photolithography is used to pattern a second array of pillars into the multilayer photolithography hard mask. The first resulting pillar array is substantially the same as the second resulting pillar array.

In one embodiment, the present invention is implemented as method for manufacturing an MRAM device. The method includes fabricating an MTJ (magnetic tunnel junction) film deposition metal stack on a CMOS wafer. The method selects between subsequent electron beam patterning for the wafer and photolithography patterning for the wafer. For electron beam patterning, an electron beam lithography hard mask is deposited onto the metal stack, and an electron beam is used to pattern a first array of pillars into the electron beam lithography hard mask to produce a first resulting pillar array. For photolithography patterning, a multilayer photolithography hard mask is deposited onto the metal stack, and photolithography is used to pattern a second array of pillars into the multilayer photolithography hard mask. The first resulting pillar array is substantially the same as the second resulting pillar array. Wafers produced with electron beam patterning and wafers produced with photolithography patterning proceed through a common subsequent MTJ fabrication process.

In this manner, embodiments of the present invention implement a method that can be easily adapted to both electron beam patterning (e.g., during research and development) and optical lithography patterning (e.g., during volume production).

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

A Process for Hard Mask Development for MRAM Pillar Formation Using Photolithography In one embodiment, the present invention is implemented as a method for fabricating an array of pillars. The method includes fabricating an MTJ (magnetic tunnel junction) film deposition metal stack on a CMOS wafer. The method selects between subsequent electron beam patterning for the wafer (e.g., for research and development wafers) and photolithography patterning for the wafer (e.g., for volume production wafers). For electron beam patterning, an electron beam lithography hard mask is deposited onto the metal stack, and an electron beam is used to pattern a first array of pillars into the electron beam lithography hard mask to produce a first resulting pillar array. For photolithography patterning, a photolithography hard mask is deposited onto the metal stack (e.g., which can accept either electron beam lithography hard masks or photolithography hard masks), and photolithography is used to pattern a second array of pillars into the photolithography hard mask to produce a second resulting pillar array. The first resulting pillar array is substantially the same as the second resulting pillar array.

Figure 1:
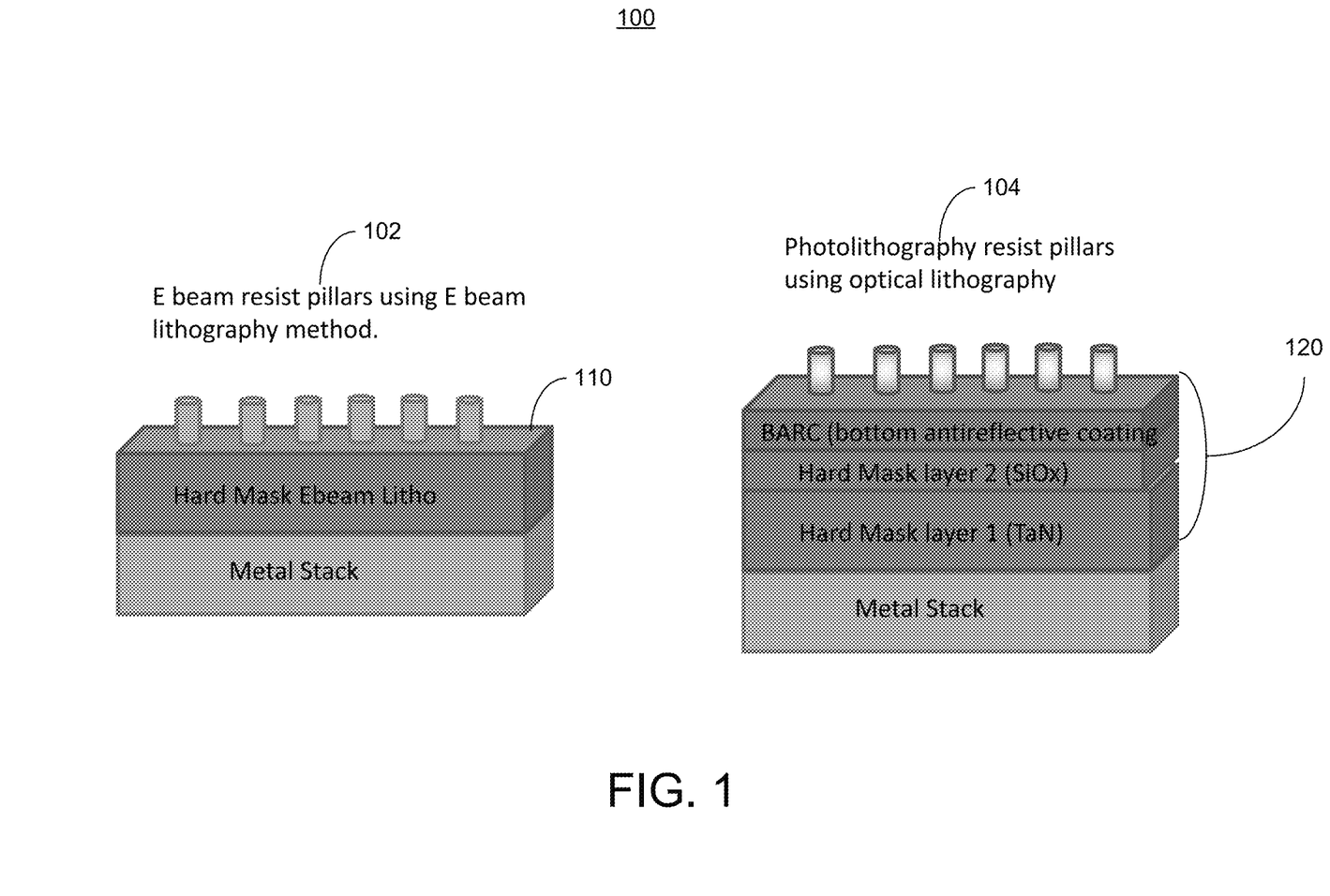
FIG. 1 shows a diagram of an electron beam patterning process and a photolithography patterning process for fabricating an array of pillars in accordance with one embodiment of the present invention.

FIG. 1 shows a diagram 100 of an electron beam patterning process 102 and a photolithography patterning process 104 for fabricating an array of pillars in accordance with one embodiment of the present invention. The diagram 100 shows an electron beam patterning process 102 and a photolithography patterning process 104 for comparison. In step 102, electron beam resist pillars are shown on top of an electron beam lithography hard mask layer 110. The hard mask layer 110 is etched using a reactive ion etch process to etch through the single hard mask layer 110 to transfer the pillar pattern into the underlying MTJ metal stack, thereby forming the MTJ pillars.

In contrast, in step 104, photolithography resist pillars are on top of a multilayer hard mask layer stack 120 that is designed for patterning using photolithography. The multilayer hard mass stack 120 in the present embodiment comprises a bottom antireflective coating layer (BARC), a hard mask layer 2 of silicon oxide, and a hard mask layer 1 of tantalum nitride, as shown. The multilayer hard mask stack 120 is etched using a reactive ion etch process to etch through the multilayer hard mask stack 120 to transfer the pillar pattern into the underlying MTJ metal stack, thereby forming the MTJ pillars.

Thus, it should be noted that embodiments of the present invention can use an MTJ metal stack that is compatible with both electron beam lithography and photolithography. For electron beam lithography, an electron beam lithography hard mask layer 110 is deposited on top of the MTJ metal stack. For photolithography, a multilayer hard mask layer stack 120 is deposited on top of the MTJ metal stack. Both processes will result in the fabrication of MTJ pillars from the MTJ metal stack.

Figure 2:
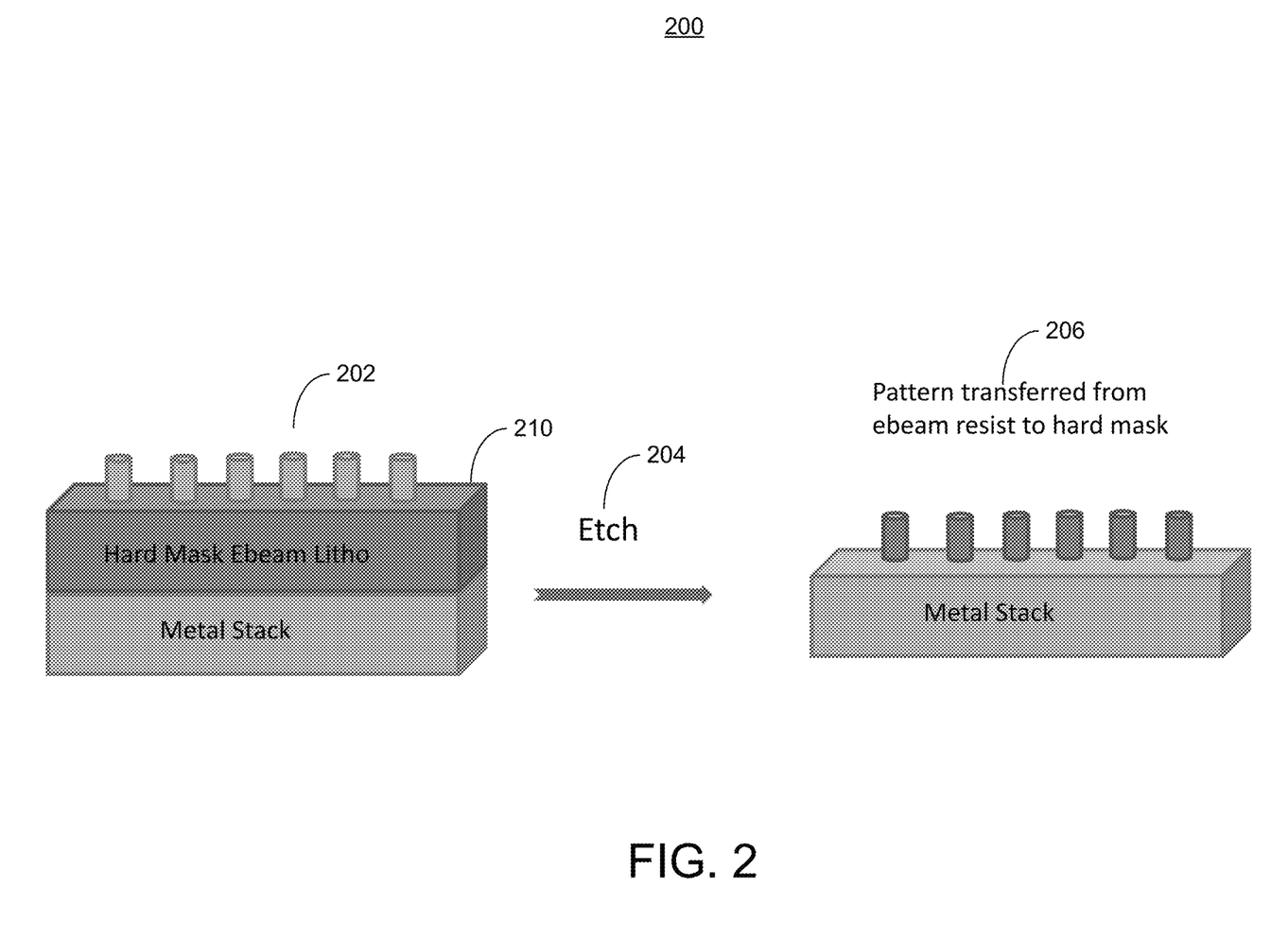
FIG. 2 shows the steps of an electron beam patterning process for fabricating an array of pillars in accordance with one embodiment of the present invention.

FIG. 2 shows the steps of an electron beam patterning process 200 for fabricating an array of pillars in accordance with one embodiment of the present invention. Process 200 shows two steps of a reference electron beam patterning process. In step 202, electron beam resist pillars are shown on top of an electron beam lithography hard mask layer 210. In step 204, the hard mask layer 210 is etched using an electron beam to form hard mask pillars on top of the MTJ metal stack. Step 206 shows the resulting hard mask pillars on top of the underlying MTJ metal stack.

Figure 3:
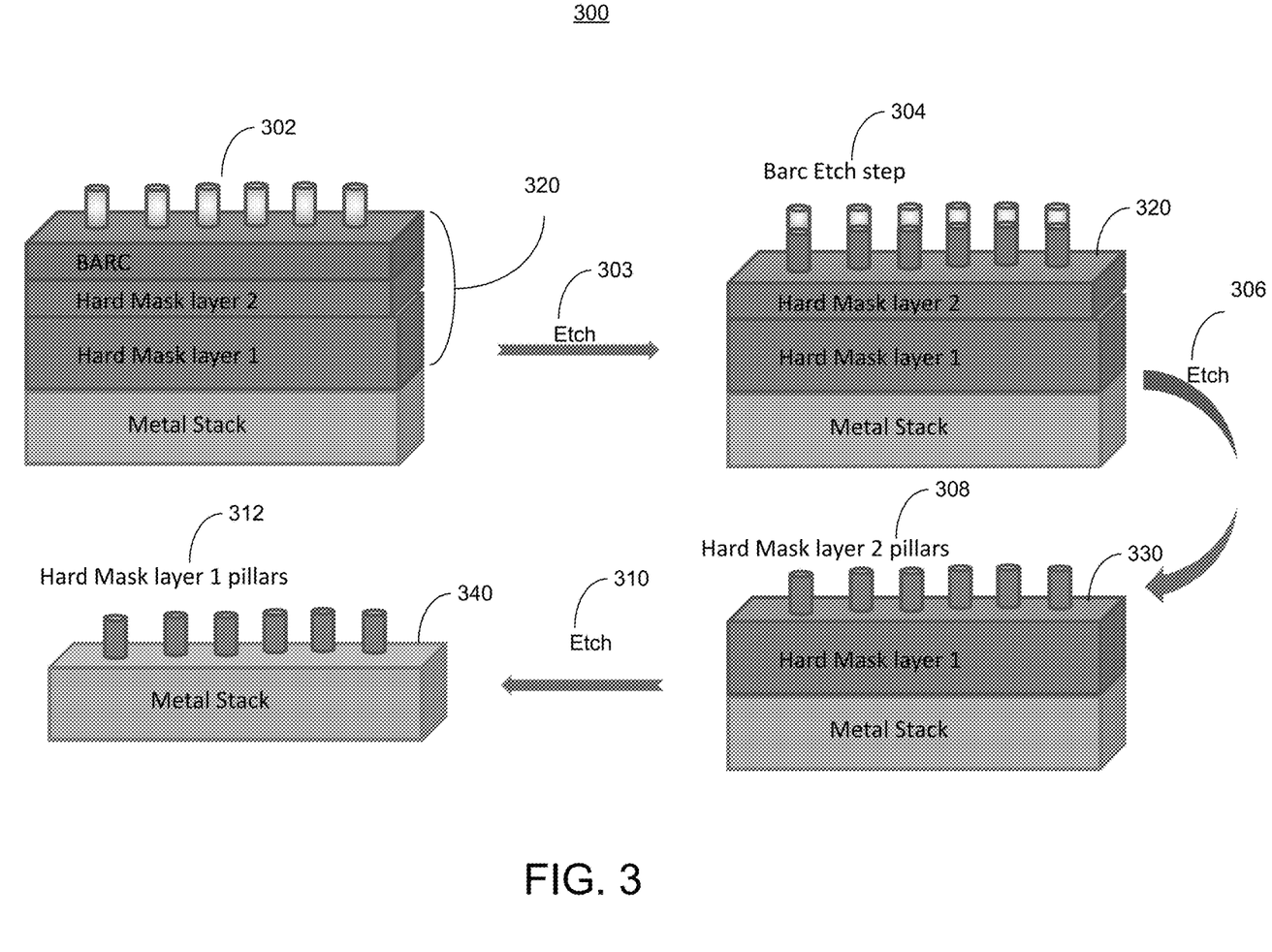
FIG. 3 shows the steps of photolithography patterning process for fabricating an array of pillars in accordance with one embodiment of the present invention.

FIG. 3 shows the steps of photolithography patterning process 300 for fabricating an array of pillars in accordance with one embodiment of the present invention. In step 302, pillars of photolithography resist are shown on top of a multilayer hard mass stack 320. The multilayer hard mass stack 320 in the present embodiment comprises a bottom antireflective coating layer (BARC), a hard mask layer 2 of silicon oxide, and a hard mask layer 1 of tantalum nitride on top of an MTJ metal stack, as shown. Step 303 is a BARC etch step. Step 304 shows the result of the BARC etch step 302, where pillars comprising leftover photoresist and BARC are formed on top of the hard mask layer 2 320. Step 306 is a first hard mask layer etch step. Step 308 shows the result of the first hard mask layer etch 306, where hard mask layer 2 pillars are formed on top of the hard mask layer 1 330. Step 310 is a second hard mask layer etch step. Step 312 shows the result of the hard mask layer etch 310, where hard mask layer 1 pillars are formed on top of the MTJ metal stack 340 as shown.

Figure 4:
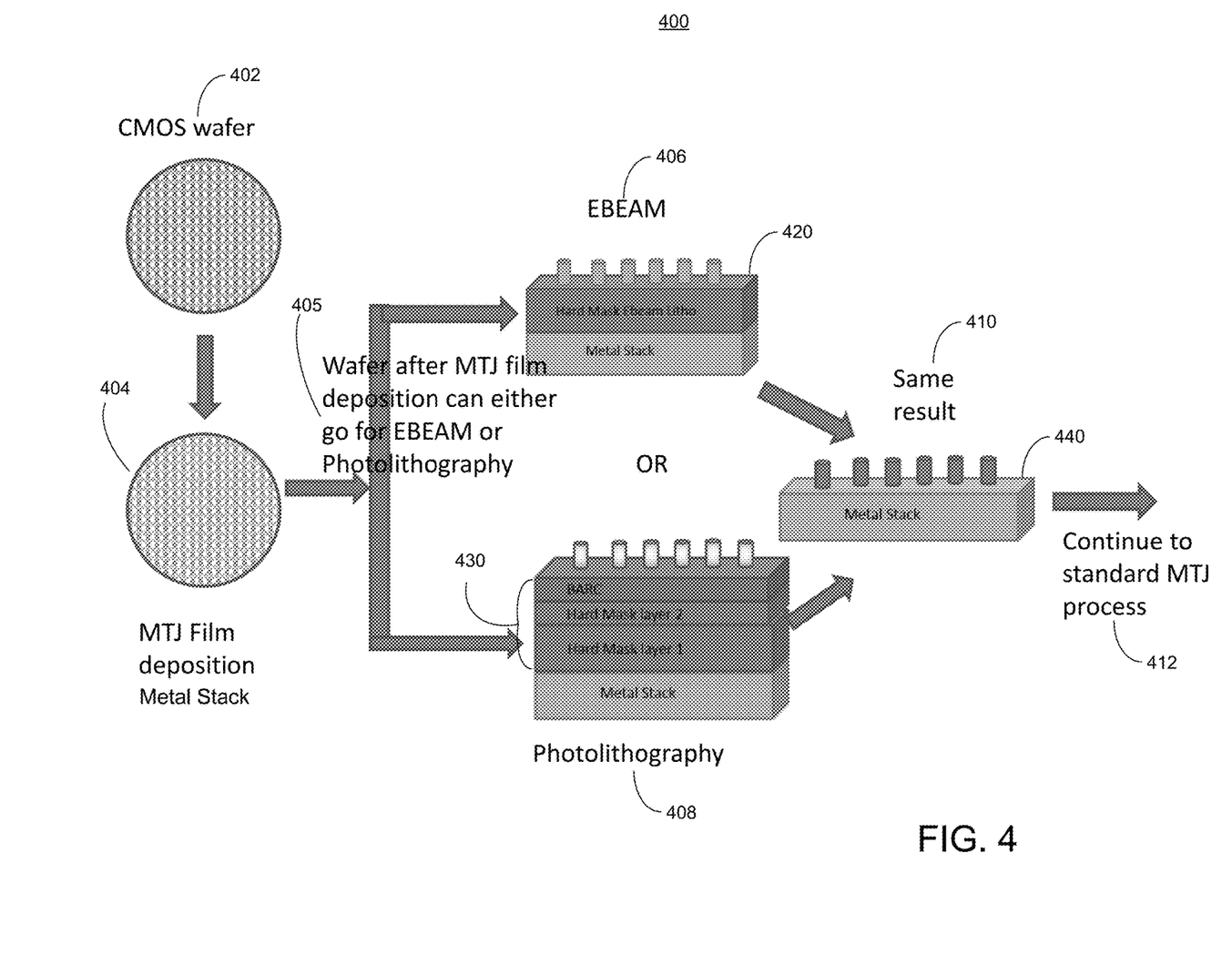
FIG. 4 shows the steps of photolithography patterning process for fabricating an array of pillars in accordance with one embodiment of the present invention.

FIG. 4 shows the steps of photolithography patterning process 400 for fabricating an array of pillars in accordance with one embodiment of the present invention. The patterning process 400 shows a process that is equally capable of using electron beam patterning or photolithographic patterning. Step 402 shows a CMOS wafer ready to receive an MTJ film deposition metal stack. Step 404 shows the CMOS wafer receiving its MTJ film deposition metal stack. In step 405, depending upon, for example, the maturity of overall MTJ manufacturing production, a choice is made as to which process will be used to create the MTJ pillars. The process can use either electron beam patterning (e.g., during research and development) or photolithography patterning (e.g., during high-volume production). As described above, whichever path is chosen dictates the type of hard layer mask which is deposited onto the MTJ metal stack.

Step 406 shows an electron beam patterning process where an electron beam is used to pattern pillars into an electron beam lithography hard mask layer 420. Step 408 shows a photolithography patterning process where photolithography is used to process a multilayer hard mask 430. Step 410 shows that both processes produce the same result of an array of hard mask pillars on top of an MTJ metal stack 440. Step 412 shows how the fabrication process continues with standard MTJ processing (e.g., pillar etching, metal deposition, and the like).

In this manner, embodiments of the present invention can use a process that is compatible with both electron beam lithography and photolithography. For electron beam lithography, an electron beam lithography hard mask layer 420 is deposited on top of the MTJ metal stack. For photolithography, a multilayer hard mask layer stack 430 is deposited on top of the MTJ metal stack. Both processes will result in the fabrication of MTJ pillars from the MTJ metal stack 440.

It should be noted that the hard mask development also includes a constraint to be able to match the hard mask layer with the electron process or to match the hard mask layer to a photoresist process to enable running wafers on either tool sets. In one embodiment, a photolithography hard mask layer comprises a multilayer development of tantalum nitride and silicon oxide, as shown above.

It should be noted that the initial photoresist mask is designed with arrays of square feature of different sizes (e.g., the pillars. The critical dimensions of the mask feature is much larger as compared to the desired critical dimensions on a completed wafer. In one embodiment, the photoresist mask is over exposed with different dose conditions to achieve the desired critical dimension target on the completed wafer.

In one embodiment, the etching is a reactive ion etching (REI) process. Three different RIE etch processes can be utilized to trim the photo resist and transfer the pattern from photo resist through different masking layers (e.g., photo resist, BARC, two layer hard mask, and the like). In one embodiment, these are RIE BARC opening to enable resist trim (e.g., mask 1 and mask 2), silicon oxide RIE for pillar formation (e.g., mask 2 and mask 3), and silicon oxide mask transfer to TaN (e.g., mask 2 through mask 4).

Figure 5:
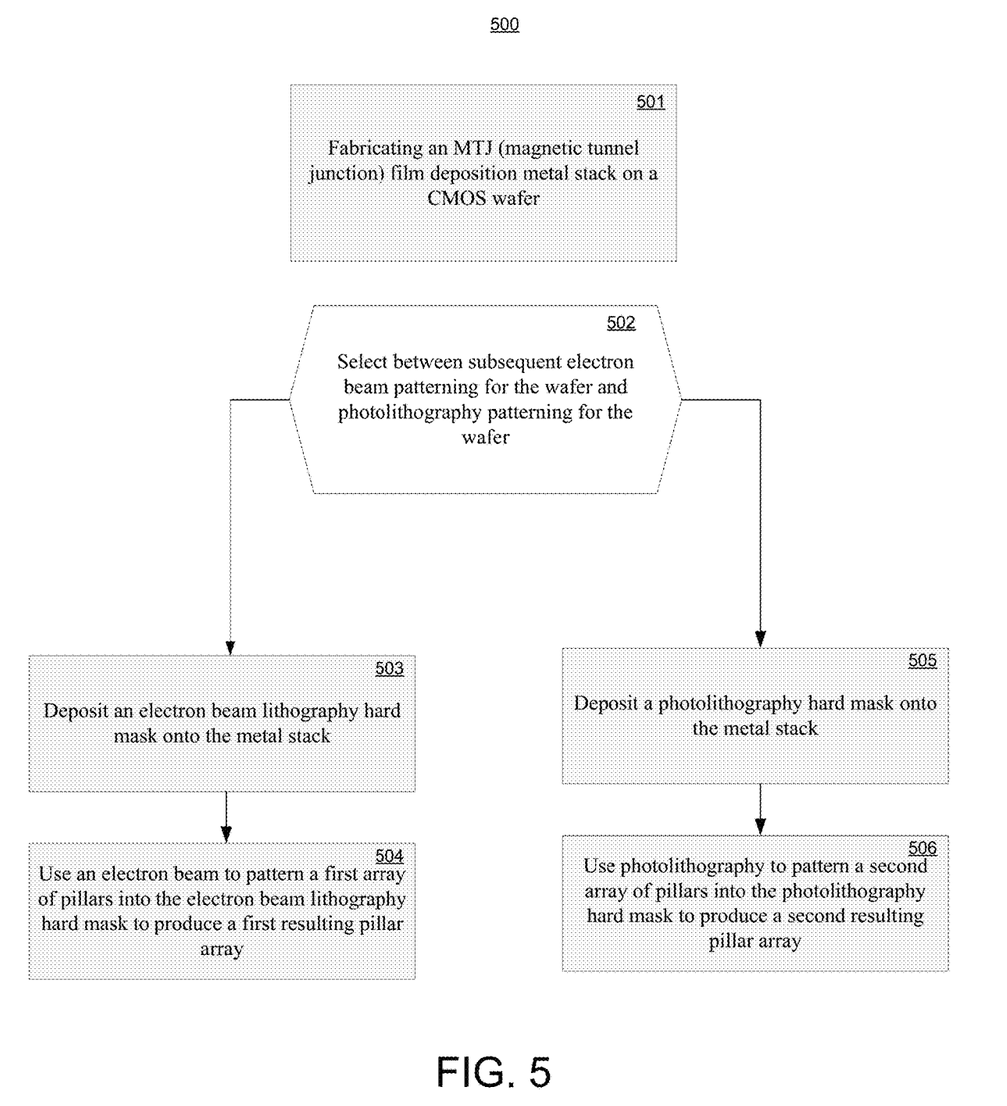
FIG. 5 shows a flowchart of the steps of a process for fabricating an array of pillars for an MRAM device in accordance with one embodiment of the present invention.

FIG. 5 shows a flowchart of the steps of a process 500 for fabricating an array of pillars for an MRAM device in accordance with one embodiment of the present invention. Process 500 begins in step 501, by fabricating an MTJ (magnetic tunnel junction) film deposition metal stack on a CMOS wafer. In step 502, a selection is made between subsequent electron beam patterning for the wafer and photolithography patterning for the wafer. In step 503, for electron beam patterning, an electron beam lithography hard mask is deposited onto the metal stack. In step 504, an electron beam is used to pattern a first array of pillars into the electron beam lithography hard mask to produce a first resulting pillar array.

In step 505, for photolithography patterning, a photolithography hard mask is deposited onto the metal stack. In step 506, photolithography is used to pattern a second array of pillars into the photolithography hard mask to produce a second resulting pillar array. It should be noted that the first resulting pillar array is substantially the same as the second resulting pillar array.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for fabricating an array of pillars, the method comprising:
    performing an MTJ manufacturing process comprising:
        fabricating an MTJ (magnetic tunnel junction) film deposition metal stack on a CMOS wafer;
        depositing a photolithography hard mask onto the metal stack;
        selecting a manufacturing process to pattern an array of pillars on the photolithography hard mask from a plurality of manufacturing processes based on a maturity level of the MTJ manufacturing process, the plurality of manufacturing processes comprising:
            a first manufacturing process that uses photolithography to pattern the array of pillars into the photolithography hard mask to produce a resulting pillar array, wherein the first manufacturing process is configured for a high-volume production phase; and
            a second manufacturing process that uses electron beam patterning to pattern the array of pillars into the photolithography hard mask to produce the resulting pillar array, wherein the second manufacturing process is configured for a research and development phase; and
        performing the selected manufacturing process to produce the resulting pillar array on the photolithography hard mask.

2. The method of claim 1, wherein reactive ion etching (REI) etches the photolithography hard mask to form hard mask pillars on top of the metal stack.

3. The method of claim 1, wherein the photolithography hard mask comprises a multilayer photolithography hard mask comprising a bottom antireflective coating (BARC) layer, a first hard mask layer, and a second hard mask layer.

4. The method of claim 3, wherein the first hard mask layer comprises tantalum nitride and the second hard mask layer comprises silicon oxide.

5. The method of claim 1, wherein the wafer produced using photolithography patterning proceeds through a subsequent MTJ fabrication process.

6. A method for producing pillar arrays in a wafer fabrication process, the method comprising:
    performing an MTJ manufacturing process comprising:
        fabricating an MTJ (magnetic tunnel junction) film deposition metal stack on a CMOS wafer;
        depositing a hard mask onto the metal stack;
        selecting a manufacturing process to pattern an array of pillars on the hard mask from a plurality of manufacturing processes based on a maturity level of the MTJ manufacturing process, the plurality of manufacturing processes comprising:
            a first manufacturing process that uses an electron beam to pattern a first array of pillars into the hard mask to produce a resulting pillar array, wherein the first manufacturing process is configured for a research and development phase; and
            a second manufacturing process that uses photolithography to pattern a second array of pillars into the hard mask to produce the resulting pillar array, wherein the manufacturing process is configured for a high-volume production phase
        performing the selected manufacturing process to produce the resulting pillar array on the hard mask.

7. The method of claim 6, further comprising performing a reactive ion etch process to etch the hard mask to form hard mask pillars on top of the metal stack, wherein the hard mask comprises an electron beam lithography hard mask.

8. The method of claim 6, further comprising performing reactive ion etching (REI) to etch the hard mask to form hard mask pillars on top of the metal stack, wherein the hard mask comprises a multilayer photolithography hard mask.

9. The method of claim 6, wherein the hard mask comprises a multilayer photolithography hard mask comprising a bottom antireflective coating (BARC) layer, a first hard mask layer, and a second hard mask layer.

10. The method of claim 9, wherein the first hard mask layer comprises tantalum nitride and the second hard mask layer comprises silicon oxide.

11. A method for manufacturing an MRAM device, the method comprising:
    performing an MTJ manufacturing process comprising:
        fabricating an MTJ (magnetic tunnel junction) film deposition metal stack on a CMOS wafer;
        depositing a hard mask onto the metal stack;
        selecting a manufacturing process to pattern an array of pillars on the hard mask from a plurality of manufacturing processes based on a maturity level of the MTJ manufacturing process, the plurality of manufacturing processes comprising:
            a first manufacturing process that uses an electron beam to pattern a first array of pillars into the electron beam lithography hard mask to produce a resulting pillar array, wherein the first manufacturing process is configured for a research and development phase; and
            a second manufacturing process that uses photolithography to pattern a second array of pillars into the hard mask to produce the resulting pillar array, wherein the second manufacturing process is configured for a high-volume production phase,
        performing the selected manufacturing process to produce the resulting pillar array on the hard mask; and
    outputting a plurality of wafers produced via the MTJ manufacturing process.

12. The method of claim 11, further comprising performing a reactive ion etch process to etch the hard mask to form hard mask pillars on top of the metal stack, wherein the hard mask comprises an electron beam lithography hard mask.

13. The method of claim 11, wherein reactive ion etching (REI) etches the hard mask to form hard mask pillars on top of the metal stack, and wherein the hard mask comprises an electron beam lithography hard mask.

14. The method of claim 11, wherein the hard mask comprises a multilayer photolithography hard mask comprising a bottom antireflective coating (BARC) layer, a first hard mask layer, and a second hard mask layer.

15. The method of claim 11, wherein the hard mask comprises a photolithography hard mask that is over exposed with multiple dose conditions to achieve a desired critical dimension target on a completed wafer.

16. The method of claim 15, wherein multiple REI processes are utilized to trim the photolithography hard mask to achieve the desired critical dimension target.

* * * * *